(12) United States Patent
Hilton (10) Patent No.: US 7,042,783 B2
(45) Date of Patent: May 9, 2006

(54) MAGNETIC MEMORY

(75) Inventor: Richard Lee Hilton, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 40 days.

(21) Appl. No.: 10/464,216

(22) Filed: Jun. 18, 2003

(65) Prior Publication Data

US 2004/0257855 A1   Dec. 23, 2004

(51) Int. Cl.
G11C 7/02 (2006.01)
G11C 11/00 (2006.01)
G11C 11/24 (2006.01)
G11C 7/00 (2006.01)

(52) U.S. Cl. ............... 365/209; 365/149; 365/150; 365/158; 365/189.07; 365/189.09; 365/207

(58) Field of Classification Search ........ 365/150, 365/66, 158, 189.07, 189.09, 209, 214, 230.07, 365/149, 171, 189.11, 207
See application file for complete search history.

(56) References Cited

U.S. PATENT DOCUMENTS

| | | | |
|---|---|---|---|
| 4,829,476 A | 5/1989 | Dupuis et al. | |
| 5,883,837 A * | 3/1999 | Calligaro et al. | 365/189.01 |
| 6,128,239 A * | 10/2000 | Perner | 365/209 |
| 6,185,143 B1 | 2/2001 | Perner et al. | |
| 6,188,615 B1 * | 2/2001 | Perner et al. | 365/189.01 |
| 6,341,084 B1 * | 1/2002 | Numata et al. | 365/158 |
| 6,381,187 B1 * | 4/2002 | Lee et al. | 365/207 |
| 6,388,917 B1 | 5/2002 | Hoffmann et al. | |
| 6,512,697 B1 * | 1/2003 | Li et al. | 365/185.21 |
| 6,707,710 B1 * | 3/2004 | Holden | 365/158 |
| 6,795,359 B1 * | 9/2004 | Baker | 365/209 |
| 6,826,094 B1 * | 11/2004 | Perner et al. | 365/189.07 |
| 6,870,784 B1 * | 3/2005 | Baker | 365/209 |
| 6,914,838 B1 * | 7/2005 | Baker | 365/205 |
| 2002/0018361 A1* | 2/2002 | Hoffmann et al. | 365/158 |
| 2004/0057318 A1* | 3/2004 | Cernea et al. | 365/226 |
| 2004/0062100 A1* | 4/2004 | Baker | 365/200 |

* cited by examiner

Primary Examiner—Amir Zarabian
Assistant Examiner—Ly Duy Pham (57) ABSTRACT

One embodiment of a magnetic memory includes a memory cell configured to provide a first state, and a sensing circuit. The sensing circuit is configured to charge a capacitor through the memory cell in the first state and discharge the capacitor through the memory cell in the first state to determine a state of the memory cell.

16 Claims, 4 Drawing Sheets

MAGNETIC MEMORY

THE FIELD OF THE INVENTION

The present invention generally relates to non-volatile memory devices, and more particularly, to memory devices that use magnetic memory cells.

BACKGROUND OF THE INVENTION

One type of non-volatile memory known in the art relies on magnetic memory cells. These devices, known as magnetic random access memory (MRAM) devices, include an array of magnetic memory cells. The magnetic memory cells may be of different types. For example, a magnetic tunnel junction (MTJ) memory cell or a giant magnetoresistive (GMR) memory cell.

Generally, the magnetic memory cell includes a layer of magnetic film in which the orientation of magnetization is alterable and a layer of magnetic film in which the orientation of magnetization may be fixed or "pinned" in a particular direction. The magnetic film having alterable magnetization is referred to as a sense layer or data storage layer and the magnetic film that is fixed is referred to as a reference layer or pinned layer. A barrier layer is located between the sense layer and the reference layer.

Conductive traces referred to as word lines and bit lines are routed across the array of memory cells. Word lines extend along rows of the memory cells and bit lines extend along columns of the memory cells. A memory cell stores a bit of information as an orientation of magnetization in the sense layer at each intersection of a word line and a bit line. The orientation of magnetization in the sense layer aligns along an axis referred to as the easy axis. Magnetic fields are applied to flip the orientation of magnetization in the sense layer along its easy axis to either a parallel or anti-parallel orientation relative to the orientation of magnetization in the reference layer.

Conductive traces referred to as write lines are routed across the array of memory cells to aid in flipping the orientation of magnetization in the sense layers. Write lines extend along columns of the memory cells near the sense layers and parallel to the bit lines. Word lines extend along rows of memory cells near the reference layers. A memory cell is situated at each intersection of a write line and a word line. The write lines and word lines are electrically coupled to a write circuit.

During a write operation, the write circuit selects one word line and one write line to change the orientation of magnetization in the sense layer of the memory cell situated at the conductors crossing point. The write circuit supplies write currents to the selected word line and write line to generate magnetic fields in the selected memory cell. The magnetic fields combine to switch the orientation of magnetization in the selected memory cell from parallel to anti-parallel or vice-versa.

The resistance through a memory cell differs according to the parallel or anti-parallel orientation of magnetization in the sense layer relative to the reference layer. The resistance is highest in an anti-parallel orientation, the logic 1 state, and lowest in a parallel orientation, the logic 0 state. The resistance through a memory cell can be used to distinguish between the parallel and anti-parallel states of a memory cell.

Word lines and bit lines aid in sensing the resistance through a memory cell to distinguish between the states of a memory cell. Word lines, are electrically coupled to reference layers. Bit lines, are electrically coupled to sense layers. The word lines and bit lines are also electrically coupled to a read circuit.

During a read operation, the read circuit selects one word line and one bit line to determine the resistance of the memory cell situated at the conductors crossing point. The read circuit supplies a voltage across the selected memory cell to generate a sense current through the memory cell. The read circuit uses the sense current to determine the resistance through the memory cell and distinguish between the parallel and anti-parallel states of the memory cell. The resistance through a memory cell can vary widely from one cell to another and from one device to another.

The resistance through a memory cell depends on barrier layer thickness and memory cell area. The barrier layer is a very thin insulating layer between the sense layer and the reference layer. This insulating layer can be aluminum oxide and Angstroms thick. The resistance through a memory cell varies exponentially with the thickness of the barrier layer. A change in barrier layer thickness of only 2 percent can change the resistance through a memory cell by a factor of 2. Also, the resistance through a memory cell is dependent on memory cell area that varies from one cell to another due to photolithography limitations. Even with tight controls, memory cell resistance varies a great deal from one cell to another and from one memory device to another. For this reason, absolute resistance values do not always accurately distinguish between the parallel and anti-parallel states of a memory cell.

SUMMARY OF THE INVENTION

One embodiment of a magnetic memory includes a memory cell configured to provide a first state, and a sensing circuit. The sensing circuit is configured to charge a capacitor through the memory cell in the first state and discharge the capacitor through the memory cell in the first state to determine a state of the memory cell.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
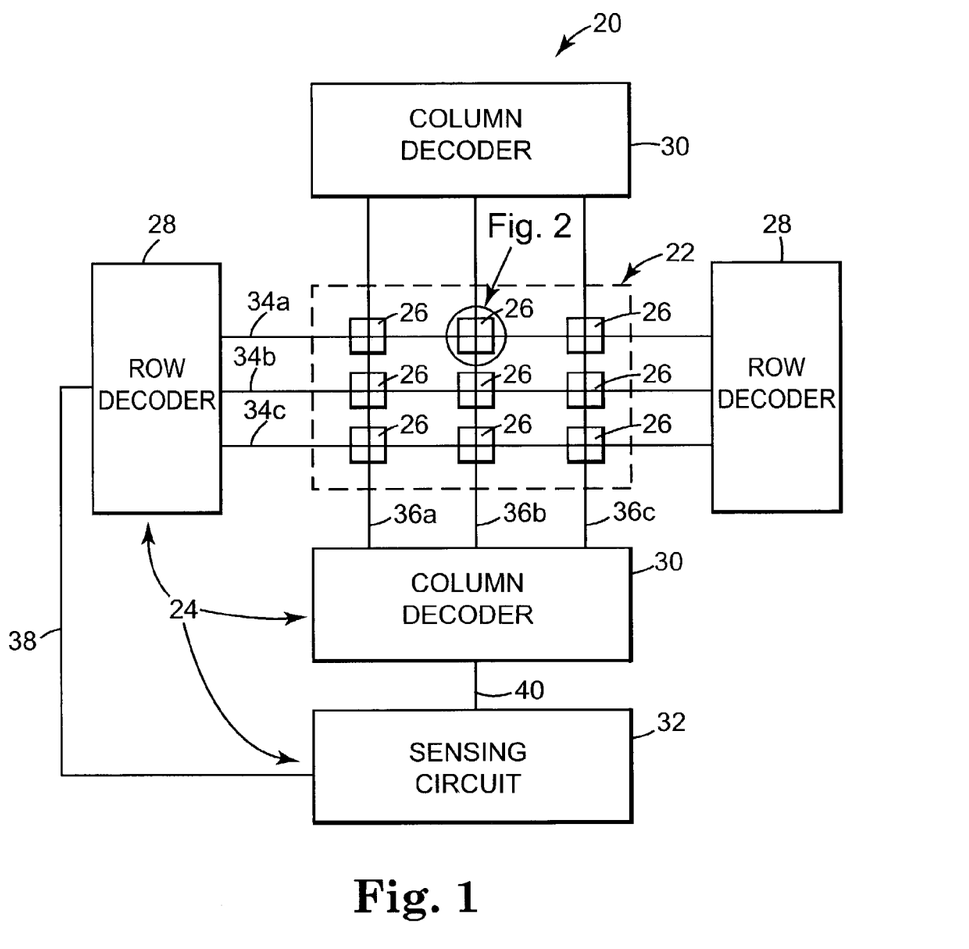
FIG. 1 is a block diagram illustrating one exemplary embodiment of a magnetic memory, according to the present invention.

FIG. 1 is a block diagram illustrating one exemplary embodiment of a magnetic memory 20, according to the present invention. Magnetic memory 20 includes a magnetic memory cell array 22 electrically coupled to a read circuit 24 and a write circuit (not shown for clarity). Array 22 includes magnetic memory cells 26 arranged in rows and columns. Each magnetic memory cell 26 stores a bit of information as a state of the magnetic memory cell 26. The state of the magnetic memory cell 26 is the parallel state or the anti-parallel state, referred to as the first state or the second state, or vice-versa. Read circuit 24 includes a row decoder 28, a column decoder 30 and a sensing circuit 32. Row decoder 28 and column decoder 30 are electrically coupled to row and column read conductors that intersect at memory cells 26. Row decoder 28 and column decoder 30 are also electrically coupled to sensing circuit 32.

In the present embodiment, sensing circuit 32 senses the resistance through a memory cell 26 and distinguishes between the parallel and anti-parallel states of the memory cell 26. The resistance through a memory cell 26 differs according to the parallel or anti-parallel orientation of magnetization in the sense layer relative to the reference layer. The resistance is highest in the anti-parallel state, logic 1, and lowest in the parallel state, logic 0. In another aspect of the resistance through memory cell 26, the resistance is different or changes with different voltages applied across memory cell 26. In the parallel state, the resistance through memory cell 26 changes little with different voltages applied across memory cell 26. In the anti-parallel state, the resistance through memory cell 26 changes more with different voltages applied across the memory cell 26. At larger or higher voltages, the resistance through memory cell 26 in the parallel and anti-parallel states approach the same resistance value. The voltages applied across memory cell 26 that make these resistance characteristics noticeable may vary from one embodiment of memory cell 26 to another. In one exemplary embodiment of memory cell 26, voltage values known to work well are a larger or higher voltage of one volt to a smaller or lower voltage of 0.5 volts. The resistance through memory cell 26 in the parallel state is essentially the same with one volt across the memory cell 26 and 0.5 volts across the memory cell 26. The resistance through memory cell 26 in the anti-parallel state is less with one volt across memory cell 26 as compared to 0.5 volts across memory cell 26. Sensing circuit 32 uses these resistance characteristics to distinguish between the parallel and anti-parallel states of memory cell 26.

Magnetic memory 20 includes magnetic memory array 22 with magnetic memory cells 26. Memory cells 26 are arranged in rows and columns, with rows extending along an x-direction and columns extending along a y-direction. Only a relatively small number of memory cells 26 are shown to simplify the illustration of the magnetic memory 20. In practice, arrays of any size may be used.

Conductive traces functioning as word lines 34a–34c and bit lines 36a–36c extend across array 22. Word lines 34a–34c extend along the x-direction in a plane on one side of array 22 and bit lines 36a–36c extend along the y-direction in a plane on an opposing side of array 22. There is one word line 34a–34c for each row of array 22 and one bit line 36a–36c for each column of array 22. A memory cell 26 is located at each cross point of a word line 34a–34c and a bit line 36a–36c.

Read circuit 24 is electrically coupled to word lines 34a–34c and bit lines 36a–36c to sense the state of memory cells 26. Read circuit 24 includes row decoder 28 electrically coupled to word lines 34a–34c, and column decoder 30 electrically coupled to bit lines 36a–36c. Row decoder 28 is electrically coupled to sensing circuit 32 through row sense conductor 38. Column decoder 30 is electrically coupled to sensing circuit 32 through column sense conductor 40.

During a read operation, row decoder 28 selects a word line 34a–34c and electrically couples it to row sense conductor 38 and sensing circuit 32. Column decoder 30 selects a bit line 36a–36c and electrically couples it to column sense conductor 40 and sensing circuit 32. The selected word line 34a–34c and bit line 36a–36c intersect at the selected memory cell 26. Sensing circuit 32 senses the resistance characteristic of the selected memory cell 26 to determine the state of the selected memory cell 26.

In one exemplary embodiment, sensing circuit 32 is an integrator. Sensing circuit 32 integrates a charge current and a discharge current on an integrator capacitor to obtain a resulting voltage. The resulting voltage is used to determine the state of a memory cell 26. In the exemplary embodiment, sensing circuit 32 provides a first voltage across memory cell 26 to charge a capacitor for a first period, and a second voltage across memory cell 26 to discharge the capacitor for a second period. The sensing circuit 32 charges the capacitor through memory cell 26 to essentially the same peak voltage, regardless of state. The second voltage is chosen small enough to make the resistance in the anti-parallel state increase a detectable amount, while the resistance in the parallel state does not change or changes little. Sensing circuit 32 discharges the capacitor through memory cell 26 to different voltages, depending on the parallel or anti-parallel state of memory cell 26. The resulting different voltages are used to determine the state of memory cell 26.

In the exemplary embodiment, the first voltage is the larger or higher voltage and the second voltage is the smaller or lower voltage. In an alternative embodiment, the first voltage, for charging the capacitor, can be the smaller voltage and the second voltage, for discharging the capacitor, can be the larger voltage. In another alternative embodiment, the sensing circuit 32 can discharge the capacitor first and charge the capacitor second to achieve resulting different voltages. In this alternative, the first and second voltages can be the larger and smaller voltages, respectively, or vice-versa.

In another embodiment, the sensing circuit applies an input signal that is a fluctuating or alternating signal to a memory cell 26. The memory cell 26 distorts the input signal into a resulting output signal. The output signal is compared to the input signal to determine the distortion in the output signal and the state of the memory cell 26. The sensing circuit includes a waveform generator that provides a sinusoidal voltage across memory cell 26. In the parallel state, the resistance through memory cell 26 changes little with different voltages applied across the memory cell 26 and the input waveform is distorted little by memory cell 26. In the anti-parallel state, the resistance through memory cell 26 changes more with different voltages applied across memory cell 26 and the input waveform is distorted more by memory cell 26. To compare the input waveform to the output waveform, the output waveform from memory cell 26 is multiplied by the first and third harmonic frequencies of the input waveform and filtered to obtain first and third harmonic components of the output. The ratio of the third harmonic component to the first harmonic component is much smaller with memory cell 26 in the parallel state as compared to the anti-parallel state. The difference in these ratios is used to determine the state of memory cell 26. These embodiments and more are described in further detail later in this specification.

Magnetic memory 20 also includes write conductors (not shown for clarity), which extend along the y-direction in a plane on one side of array 22. The write conductors are electrically coupled to the write circuit for altering the orientation of magnetization in memory cells 26. Word lines 34a–34c, which extend along the x-direction on an opposing side of array 22, are also electrically coupled to the write circuit. A magnetic memory cell 26 is located at each cross point of a write conductor and a word line 34a–34c.

During a write operation, the write circuit selects one write conductor and one word line 34a–34c to change the orientation of magnetization in the sense layer of the memory cell 26 located at the cross point. The write circuit supplies one write current to the selected write conductor and a second write current to the selected word line 34a–34c. These write currents create magnetic fields around the write conductor and word line 34a–34c, according to the write hand rule, to change the orientation of magnetization in the sense layer of the selected memory cell 26.

Figure 2:
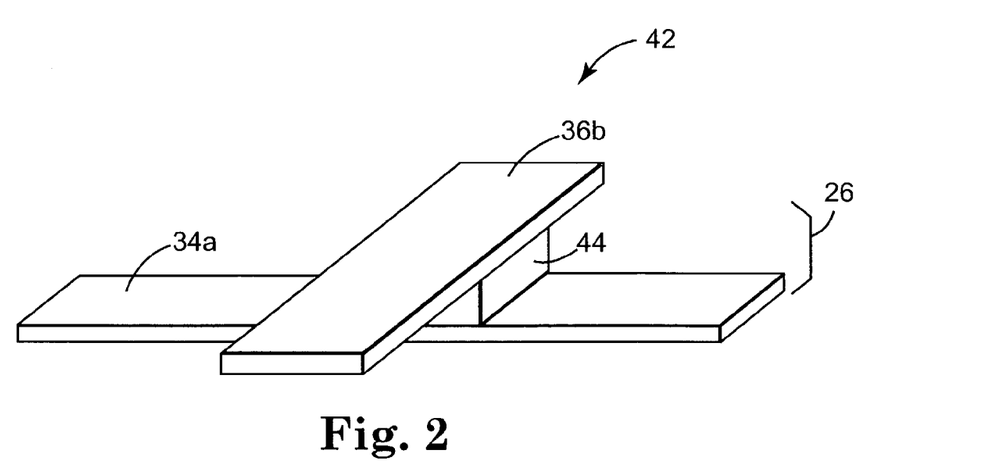
FIG. 2 is a diagram illustrating an exemplary embodiment of an array section including a magnetic memory cell.

FIG. 2 is a diagram illustrating an exemplary embodiment of an array section 42 including a magnetic memory cell 26. Each memory cell 26 in array 22 is configured similar to memory cell 26 in array section 42. Memory cell 26 includes word line 34a, bit line 36b and memory cell stack 44. Memory cell stack 44 is located between word line 34a and bit line 36b. Although word line 34a is illustrated as essentially orthogonal to bit line 36b, word line 34a can lie in other angular relations to bit line 36b.

Figure 3:
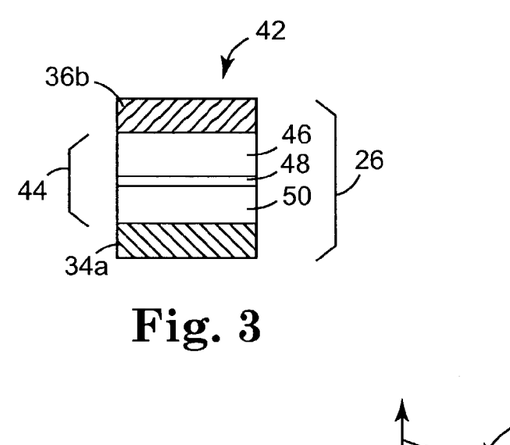
FIG. 3 is a diagram illustrating a cross section of an exemplary embodiment of an array section and magnetic memory cell.

FIG. 3 is a diagram illustrating a cross section of the exemplary embodiment of array section 42 and memory cell 26. Memory cell 26 includes memory cell stack 44 located between word line 34a and bit line 36b. In this embodiment, memory cell stack 44 includes a sense layer 46, a barrier layer 48 and a reference layer 50. Barrier layer 48 is located between sense layer 46 and reference layer 50. The resistance through memory cell (i.e., the state of the memory cell) 26 is sensed through bit line 36b, sense layer 46, barrier layer 48, reference layer 50 and word line 34a.

Figure 4:
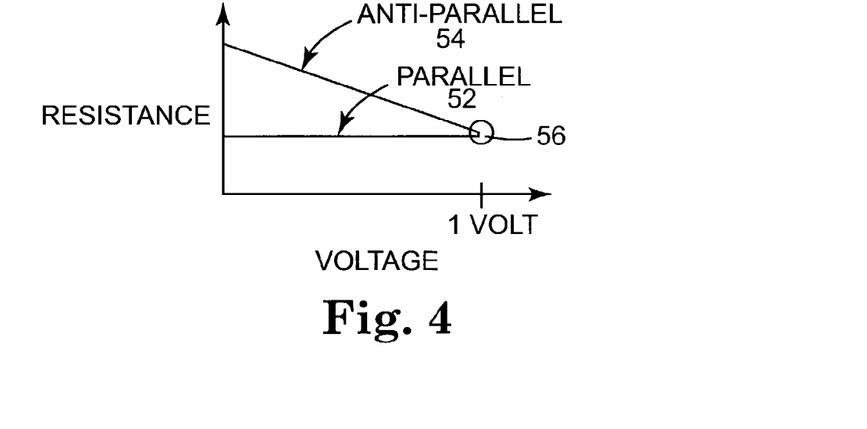
FIG. 4 is a graph illustrating the resistance through a memory cell versus the voltage applied across the memory cell.

FIG. 4 is a graph illustrating the resistance through memory cell 26 versus the voltage applied across memory cell 26. In this exemplary embodiment of memory cell 26, the resistance through memory cell 26 in the parallel state, indicated at 52, is essentially the same across a voltage range from zero to one volt. In contrast, the resistance through memory cell 26 in the anti-parallel state, indicated at 54, varies from a low value at one volt to a larger value at zero volts. As indicated at 56, the resistance through memory cell 26 in the parallel state is essentially the same as the resistance through memory cell 26 in the anti-parallel state, at about one volt across memory cell 26.

The resistance through memory cell 26 varies from one cell to another and from one memory device to another by as much as one mega-Ohm or more. However, the resistance characteristics illustrated in FIG. 4 do not change as the absolute resistance through memory cell 26 varies. With this electrical characteristic, the embodiments of the present invention correctly sense the state of memory cell 26 regardless of the absolute resistance through memory cell 26.

Figure 5:
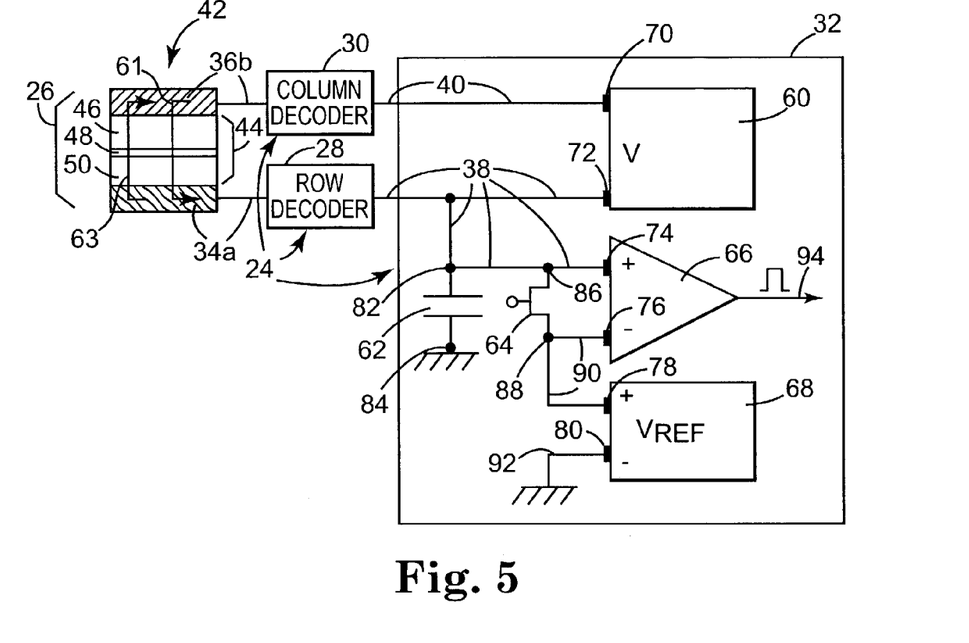
FIG. 5 is a diagram illustrating an exemplary embodiment of a read circuit in electrical communication with a memory cell.

FIG. 5 is a diagram illustrating an exemplary embodiment of read circuit 24 in electrical communication with memory cell 26 of array section 42. Read circuit 24 includes sensing circuit 32, row decoder 28 and column decoder 30. Sensing circuit 32 is electrically coupled to row decoder 28 through row sense conductor 38, and sensing circuit 32 is electrically coupled to column decoder 30 through column sense conductor 40.

Memory cell 26 includes memory cell stack 44 located between word line 34a and bit line 36b. Memory cell stack 44 includes barrier layer 48 located between sense layer 46 and reference layer 50. Row decoder 28 is electrically coupled to memory cell 26 through word line 34a, and column decoder 30 is electrically coupled to memory cell 26 through bit line 36b.

Sensing circuit 32 includes a voltage source 60, an integrator capacitor 62, a transistor switch 64, a comparator 66 and a reference voltage source 68. The voltage source 60 includes a first terminal 70 and a second terminal 72. Comparator 66 includes a positive input terminal 74 and a negative input terminal 76. Reference voltage source 68 includes a positive terminal 78 and a negative terminal 80. Capacitor 62 has a first capacitor contact 82 and a second capacitor contact 84, and transistor switch 64 has a first contact 86 and a second contact 88.

Voltage source 60 is electrically coupled to column decoder 30, row decoder 28, capacitor 62, transistor switch 64 and comparator 66. Voltage source 60 is electrically coupled to column decoder 30 through column sense conductor 40 and first terminal 70. Voltage source 60 is electrically coupled to row decoder 28, capacitor 62, transistor switch 64 and comparator 66 through row sense conductor 38 and second terminal 72. Capacitor 62 is electrically coupled to row sense conductor 38 at first capacitor contact 82 and to a reference potential, (e.g., ground) at second capacitor contact 84. Transistor switch 64 is electrically coupled to row sense conductor 38 at first contact 86, and comparator 66 is electrically coupled to row sense conductor 38 at positive input terminal 74.

Reference voltage source 68 is electrically coupled to transistor switch 64 and comparator 66 through reference source conductor 90 and positive terminal 78. Transistor switch 64 is coupled to reference source conductor 90 at second contact 88, and comparator 66 is coupled to reference source conductor 90 at negative input terminal 76. Reference voltage source 68 is electrically coupled to the reference potential, (e.g., ground) through reference potential line 92 and negative terminal 80.

In operation, voltage source 60 applies a voltage across memory cell 26 through column decoder 30 and row decoder 28. If first terminal 70 is positive with respect to second terminal 72, voltage source 60 provides a charge current 61 that flows out of first terminal 70, through column decoder 30, memory cell 26 and row decoder 28 into capacitor 62. Charge current 61 charges capacitor 62 through memory cell 26. If first terminal 70 is less than second terminal 72, capacitor 62 supplies a discharge current 63 that flows through row decoder 28, memory cell 26 and column decoder 30 into voltage source 60 at first terminal 70. Discharge current 63 discharges capacitor 62 through memory cell 26.

Comparator 66 compares the voltage on capacitor 62 to the reference voltage from reference voltage source 68. If the voltage on capacitor 62 is greater than the reference voltage, comparator output 94 is high. If the voltage on capacitor 62 is less than the reference voltage, comparator output 94 is low. The comparator output 94 is latched into a storage element at the appropriate time to store the state of memory cell 26. Transistor switch 64 is closed to reset capacitor 62 to the reference voltage from reference voltage source 68. Transistor switch 64 is opened to read memory cell 26.

During a read operation, read circuit 24 selects a memory cell 26 from array 22. As illustrated in FIG. 5, row decoder 28 selects one word line 34a and column decoder 30 selects one bit line 36b to select memory cell 26 of array section 42. Before applying any voltages across memory cell 26, capacitor 62 is charged to a beginning voltage. In the present embodiment, the beginning voltage is the reference voltage supplied by reference voltage source 68. Closing transistor switch 64 before or after selecting memory cell 26 charges capacitor 62 to the beginning voltage. Transistor switch 64 is opened after capacitor 62 is charged to the reference voltage.

Next, voltage source 60 applies a first voltage across memory cell 26 for a first period to charge capacitor 62 through memory cell 26. This first voltage is held constant across memory cell 26 for the entire first period. To explain further, first terminal 70 is held at a higher voltage than second terminal 72. The difference in voltages on terminals 70 and 72 is the first voltage. The first voltage across memory cell 26 creates charge current 61, which charges capacitor 62. As the voltage on capacitor 62 rises, the voltage at first terminal 70 correspondingly rises to keep the first voltage constant across memory cell 26. This provides a constant charge current 61 through memory cell 26. Charge current 61 corresponds to the resistance through memory cell 26.

In the exemplary embodiment, read circuit 24 initially charges the capacitor 62 and then discharges the capacitor 62 to a resulting voltage. In other embodiments, the read operation can first or initially discharge the capacitor 62 and then charge the capacitor 62 to the resulting voltage. Also, in the exemplary embodiment, the first voltage is chosen to be the larger voltage and the second voltage is chosen to be the smaller voltage. In other embodiments, the first voltage can be the smaller voltage and the second voltage can be the larger voltage.

The larger voltage is chosen to make the resistance through memory cell 26 in the anti-parallel state smaller, relative to the resistance through memory cell 26 in the anti-parallel state with the smaller voltage across it. In the parallel state, the resistance through memory cell 26 changes little with the voltage across the memory cell 26. The larger voltage can be chosen to make the resistance through memory cell 26 essentially the same in the parallel and anti-parallel states. However, this is not a requirement. The larger voltage is chosen to make the resistance through memory cell 26 in the anti-parallel state smaller, as compared to the resistance through memory cell 26 in the anti-parallel state with the smaller voltage across it.

In the exemplary embodiment, the first voltage essentially equalizes the resistance through memory cell 26 in the parallel and anti-parallel states. In the exemplary embodiment of memory cell 26, a first voltage of one volt works well. With the first voltage held at one volt, charge current 61 is the same with memory cell 26 in the parallel and anti-parallel states. Charge current 61 charges capacitor 62 to the same peak voltage over the first time period, regardless of the state of memory cell 26. It will be apparent to one skilled in the art that other suitable voltages for the first voltage can be chosen.

Next, voltage source 60 provides a second voltage across memory cell 26 for a second period to discharge capacitor 62. The second voltage is held constant across memory cell 26 for the entire second period. To explain further, first terminal 70 is held at a lower voltage than second terminal 72. The difference in voltages on terminals 70 and 72 is the second voltage. The second voltage applied across memory cell 26 creates discharge current 63, which discharges capacitor 62. As the voltage on capacitor 62 falls, the voltage at first terminal 70 correspondingly falls to keep the second voltage constant across memory cell 26. This provides a constant discharge current 63 through memory cell 26. Discharge current 63 corresponds to the resistance through memory cell 26.

In the present embodiment, the second voltage is the smaller voltage. The smaller voltage makes the resistance through memory cell 26 in the anti-parallel state larger, as compared to the resistance through memory cell 26 in the anti-parallel state with the larger voltage across memory cell 26. The second voltage makes the resistance through memory cell 26 in the parallel state less than the resistance through memory cell 26 in the anti-parallel state. With the second voltage applied across memory cell 26, the resistance through memory cell 26 in the anti-parallel state increases up to about 15 percent as compared to the resistance through memory cell 26 with the first voltage applied across memory cell 26. The resistance through memory cell 26 in the parallel state does not change with the change in voltage from the first voltage to the second voltage.

With the second voltage held constant, discharge current 63 differs according to the state of memory cell 26. Discharge current 63 is larger if memory cell 26 is in the parallel state and smaller if memory cell 26 is in the anti-parallel state. Discharge current 63 discharges capacitor 62 over the second period to a first discharge voltage with memory cell 26 in a first state, and to a second discharge voltage with memory cell 26 in a second state. Where the first state and the second state are the parallel state and anti-parallel state or, in the alternative, the anti-parallel state and the parallel state of memory cell 26, respectively. The resulting voltage on capacitor 62 with memory cell 26 in the anti-parallel state, hereafter referred to as the anti-parallel state discharge voltage, is higher than the resulting voltage on capacitor 62 with memory cell 26 in the parallel state, hereafter referred to as the parallel state discharge voltage. A threshold voltage between the anti-parallel and parallel state discharge voltages is chosen to distinguish between the anti-parallel and parallel states of memory cell 26.

In the present exemplary embodiment, the threshold voltage is chosen to be the reference voltage from reference voltage source 68, and also chosen to be halfway between the parallel and anti-parallel state discharge voltages to reliably distinguish between the states. The values for the first voltage, first period, second voltage and second period are chosen to set the reference voltage halfway between the parallel and anti-parallel state discharge voltages.

Since the voltage on capacitor 62 at the beginning of the read operation is set to the reference voltage, for an example discharge voltage to equal the reference voltage, the charge added to capacitor 62 equals the charge removed from capacitor 62.

The charge equation for this is:

$$\frac{V_H}{R} \cdot T_H = \frac{V_L}{R(1+\Delta)} \cdot T_L$$

Which reduces to:

$$\frac{V_H}{V_L} = \frac{T_L}{T_H} \cdot \frac{1}{(1+\Delta)}$$

Where:

$V_H$ equals the first voltage (or high voltage), $V_L$ equals the second voltage (or low voltage), $T_H$ equals the first period, $T_L$ equals the second period, R equals the resistance through memory cell 26 with $V_H$ applied, and Δ equals the change in resistance through memory cell 26 with the second voltage applied as compared to the first voltage.

For the example discharge voltage to be halfway between the parallel state discharge voltage and anti-parallel state discharge voltage, the change in resistance through memory cell 26 with the second voltage applied as compared to the first voltage is halfway between the parallel state change in resistance and the anti-parallel state change in resistance. At the second voltage, the resistance through memory cell 26 in the anti-parallel state increases up to about 15 percent as compared to the resistance through memory cell 26 with the first voltage applied across memory cell 26. The resistance through memory cell 26 in the parallel state does not change with the change in voltage from the first voltage to the second voltage. For a discharge voltage to be halfway between the parallel state and anti-parallel state discharge voltages, the change in resistance must be halfway between 15 and 0 percent, or 7.5 percent.

To solve the second equation, the first voltage $V_H$ is set equal to one volt and Δ is set equal to 7.5 percent or 0.075. Choosing the second time period $T_L$ to be twice as long as the first time period $T_H$ results in a second voltage $V_L$ of 0.538 volts. The charge equation is solved using the Δ of 0.075, which results in the threshold value, reference voltage, being halfway between the parallel state discharge voltage and the anti-parallel state discharge voltage.

The absolute resistance R through memory cell 26 cancels out of the reduced equation and sensing circuit 32 uses the change in resistance, not the absolute resistance R to determine the state of memory cells 26. Also, changing the value of capacitor 62 sets the voltage gain. A smaller capacitor 62 gives a larger gain but limits dynamic range. Cycling between the first voltage and second voltage multiple times with a duty cycle consistent with the first and second periods attains improved gain. To repeat a read operation on the same memory cell 26 or a different memory cell 26, transistor switch 64 is closed and opened and the process repeated.

Figure 6:
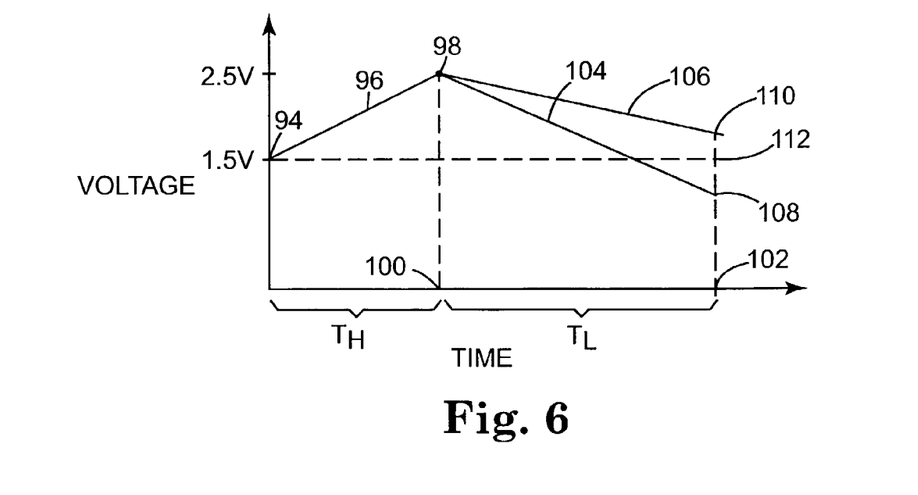
FIG. 6 is a graph illustrating the voltage on a capacitor versus time during an example read operation.

FIG. 6 is a graph illustrating the voltage on capacitor 62 versus time during an example read operation. As indicated at 94, the voltage on capacitor 62 begins at a reference voltage of 1.5 volts. Closing transistor switch 64 sets this voltage by applying the reference voltage from reference voltage source 68 to first contact 82 on capacitor 62. After the voltage on capacitor 62 has reached 1.5 volts, transistor switch 64 is opened for the remainder of the read operation.

Next, voltage source 60 applies the first voltage across memory cell 26 to charge capacitor 62 through memory cell 26. In this example, the first voltage is one volt. The voltage on capacitor 62 ramps up, as indicated at 96, to a peak voltage 98. The peak voltage 98 is attained at the end of first period $T_H$, indicated at 100. Peak voltage 98 on capacitor 62 does not depend on the parallel or anti-parallel state of memory cell 26. The resistance through memory cell 26 is the same regardless of state with one volt applied across the present embodiment of memory cell 26. Capacitor 62 charges to one peak voltage 98.

Next, voltage source 60 reverses the polarity on first terminal 70 and second terminal 72 to apply the second voltage across memory cell 26 and discharge capacitor 62. The second voltage of 0.538 volts is applied for the second period $T_L$. In this example, second period $T_L$ is twice as long as first period $T_H$. At 0.538 volts, the resistance through memory cell 26 in the anti-parallel state is about 15 percent greater than the resistance through memory cell 26 at one volt. The voltage on capacitor 62 ramps down with memory cell 26 in the anti-parallel state, as indicated at 106, and the voltage on capacitor 62 ramps down with memory cell 26 in the parallel state, as indicated at 104. The voltage on capacitor 62 discharges to the parallel state discharge voltage, indicated at 108, and to the anti-parallel state discharge voltage, indicated at 110. The anti-parallel state discharge voltage 110 is greater than the parallel state discharge voltage 108.

The threshold voltage 112 is equal to the reference voltage of 1.5 volts. Comparator 66 uses the reference voltage of 1.5 volts to distinguish between the parallel state discharge voltage 108 and the anti-parallel state discharge voltage 110. The comparator output 94 is high if memory cell 26 is in the anti-parallel state and low if memory cell 26 is in the parallel state. The comparator output voltage 94 is sampled at the end of second period $T_L$, indicated at 102, and the state of memory cell 26 is recorded. In this manner and with this sensing circuit 32, the state of memory cell 26 is non-destructively read.

In other embodiments, the larger voltage is not chosen to make the resistance through memory cell 26 essentially the same in the parallel and anti-parallel states. In these embodiments, the capacitor 62 charges to different peak voltages with memory cell 26 in different states. The second voltage discharges the capacitor 62 to different resulting voltages and a suitable reference voltage is chosen to distinguish the parallel and anti-parallel states.

In another embodiment, the first voltage can be the smaller voltage and the first period the longer period for charging the capacitor 62. In these embodiments, the second voltage is the larger voltage and the second period can be the shorter period for discharging the capacitor 62. In other embodiments, the capacitor 62 can be first discharged with the larger voltage and shorter time period and then charged with the smaller voltage and longer time period. Alternatively, the capacitor 62 can be first discharged with the smaller voltage and longer time period and then charged with the larger voltage and shorter time period.

Sensing circuit 32 does not use the absolute resistance R of memory cell 26 to determine its state. Instead, sensing circuit 32 uses the change in resistance versus voltage characteristics of memory cell 26 to determine its state. Also, sensing circuit 32 does not use multiple reads and writes to determine the state of memory cell 26. Instead, sensing circuit 32 does a single, non-destructive read of memory cell 26, conserving time and power, where the state of memory cell 26 can be sensed a second time in a retry if needed. Sensing circuit 32 also conserves space on magnetic memory 20 by not using reference cells or complimentary memory cells to sense the state of memory cell 26.

Figure 7:
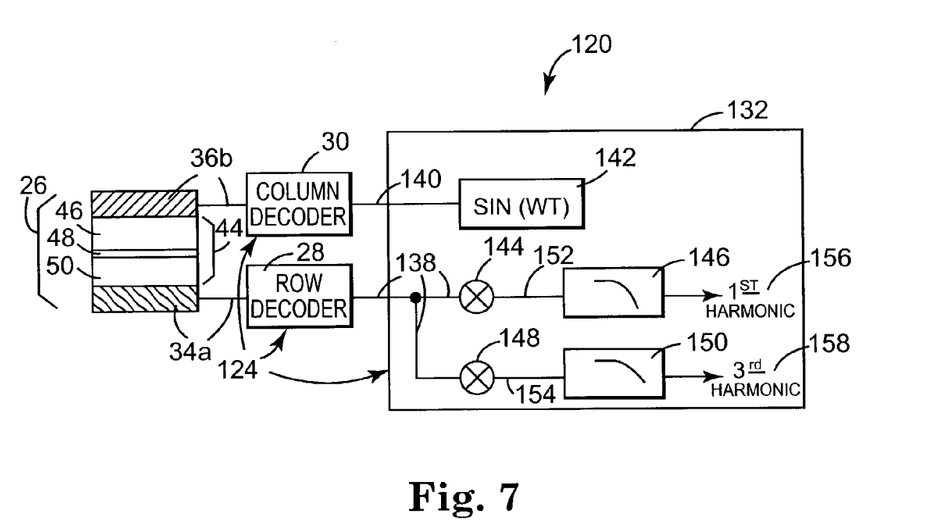
FIG. 7 is a diagram illustrating another exemplary embodiment of a magnetic memory, according to the present invention.

FIG. 7 is a diagram illustrating another exemplary embodiment of a magnetic memory 120, according to the present invention. Magnetic memory 120 includes a read circuit 124, a write circuit (not shown) and magnetic memory cell array 22 (not shown). Read circuit 124 includes row decoder 28, column decoder 30 and another exemplary embodiment of a sensing circuit indicated at 132. Sensing circuit 132 is electrically coupled to row decoder 28 through row sense conductor 138, and to column decoder 30 through column sense conductor 140. Magnetic memory 120 is identical to magnetic memory 20, previously described in detail in this specification, in all other respects. Only sensing circuit 32, row sense conductor 38 and column sense conductor 40 have been replaced by sensing circuit 132, row sense conductor 138 and column sense conductor 140.

Array 22 includes magnetic memory cells 26 arranged in rows and columns, and having resistance versus voltage characteristics in the parallel and anti-parallel states as previously described in detail in this specification. As illustrated in FIG. 7, memory cell 26 includes memory cell stack 44 located between word line 34a and bit line 36b. Memory cell stack 44 includes barrier layer 48 located between sense layer 46 and reference layer 50.

Read circuit 124 includes row decoder 28, column decoder 30 and sensing circuit 132. Sensing circuit 132 is electrically coupled to row decoder 28 through row sense conductor 138, and to column decoder 30 through column sense conductor 140. Row decoder 28 and column decoder 30 are electrically coupled to array 22 through word lines 34a–34c and bit lines 36a–36c, as previously described. As illustrated in FIG. 7, row decoder 28 has selected word line 34a and column decoder 30 has selected bit line 36b to select memory cell 26. Row decoder 28 is electrically coupled to memory cell 26 through word line 34a, and column decoder 30 is electrically coupled to memory cell 26 through bit line 36b.

Sense circuit 132 includes a waveform generator 142, first harmonic frequency multiplier 144, first harmonic filter 146, third harmonic frequency multiplier 148 and third harmonic filter 150. Waveform generator 142 is electrically coupled to column decoder 30 through column sense conductor 140. First harmonic frequency multiplier 144 is electrically coupled to row decoder 28 and third harmonic frequency multiplier 148 through row sense conductor 138. First harmonic filter 146 is electrically coupled to first harmonic frequency multiplier 144 through first harmonic conductor 152. Third harmonic filter 150 is electrically coupled to third harmonic frequency multiplier 148 through third harmonic conductor 154.

Waveform generator 142 applies an alternating signal to memory cell 26 through column decoder 30. The alternating signal applied to memory cell 26 creates an alternating output from memory cell 26. This alternating output corresponds to the resistance through memory cell 26 in a first state or a second state. Where the first state and second state are the parallel and anti-parallel states of memory cell 26 or, in the alternative, the anti-parallel and parallel states of memory cell 26, respectively. Applying the alternating signal to memory cell 26 in the first state creates a first output from memory cell 26, and applying the alternating current to memory cell 26 in the second state creates a second output from memory cell 26. Due to the different resistance versus voltage characteristics of memory cell 26 in the first and second states, the first and second outputs include different harmonic components, i.e., distortions, of the alternating signal provided by waveform generator 142. In the present embodiment, the alternating signal is an alternating voltage, and more specifically, a sinusoidal voltage. In other embodiments, waveform generator 142 can apply other signals, such as a square wave or a triangle wave, or alternating currents.

First harmonic frequency multiplier 144 receives the alternating output, which is a sinusoidal output in the form of a current, from memory cell 26 through row decoder 28. First harmonic frequency multiplier 144 multiples the sinusoidal output by the first harmonic frequency of the sinusoidal voltage provided by waveform generator 142. Third harmonic frequency multiplier 148 also receives the sinusoidal output through memory cell 26 and row decoder 28, and multiplies the sinusoidal output by the third harmonic frequency of the sinusoidal voltage provided by waveform generator 142. First harmonic frequency multiplier 144 provides a first harmonic signal to first harmonic filter 146, which filters the received signal to produce a first harmonic component 156 from the first harmonic signal. Third harmonic filter 150 receives the third harmonic signal from the third harmonic frequency multiplier 148 and filters this signal to obtain a third harmonic component 158.

In operation, waveform generator 142 provides a sinusoidal voltage across memory cell 26. The current through memory cell 26 is the sinusoidal output received by first harmonic frequency multiplier 144 and third harmonic frequency multiplier 148. This sinusoidal output corresponds to the resistance through memory cell 26 in the first state or the second state. Where the first state and second state are the parallel and anti-parallel states of memory cell 26 or, in the alternative, the anti-parallel and parallel states of memory cell 26, respectively. With memory cell 26 in the parallel state, the current received through memory cell 26 includes very little harmonic distortion. The current is directly proportional to the sinusoidal voltage provided by waveform generator 142. However, with memory cell 26 in the anti-parallel state, the current received through memory cell 26 includes much more harmonic distortion, and the sinusoidal output is not directly proportional to the sinusoidal voltage provided by waveform generator 142. This is due to the resistance versus voltage characteristics through memory cell 26. In the parallel state, the resistance through memory cell 26 changes very little with changes in voltage across memory cell 26. In the anti-parallel state, the resistance through memory cell 26 changes much more, up to 15 percent, with changes in the voltage across memory cell 26.

The sinusoidal output received through memory cell 26 passes through row decoder 28 to first harmonic frequency multiplier 144 and third harmonic frequency multiplier 148. First harmonic frequency multiplier 144 multiplies the received sinusoidal output by a sinusoidal waveform having the same frequency as the sinusoidal voltage provided by waveform generator 142. The first harmonic signal from first harmonic frequency multiplier 144 is filtered by first harmonic filter 146 to obtain the first harmonic component 156. The third harmonic frequency multiplier 148 multiplies the received sinusoidal output by a sinusoidal waveform having a frequency three times the frequency of the sinusoidal voltage provided by waveform generator 142. The third harmonic signal from third harmonic frequency multiplier 148 is filtered by third harmonic filter 150 to obtain a third harmonic component 158.

The sinusoidal output received through memory cell 26 in the parallel state has different harmonic components than the sinusoidal output received from memory cell 26 in the anti-parallel state. With memory cell 26 in the parallel state, the first harmonic component 156 is very large and the third harmonic component 158 is essentially non-existant. With memory cell 26 in the anti-parallel state, the first harmonic component 156 is smaller and the third harmonic component 158 is much larger. The parallel and anti-parallel states of memory cell 26 can be distinguished using the ratio of the third harmonic component 158 to the first harmonic component 156.

Figure 8:
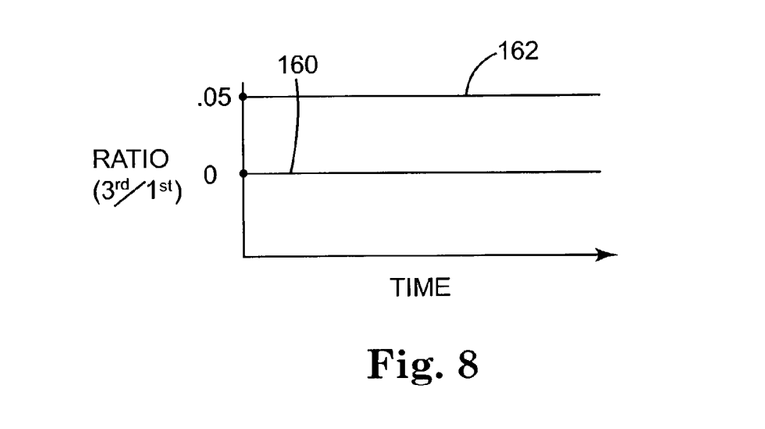
FIG. 8 is a graph illustrating the ratio of the third harmonic component to the first harmonic component for the parallel and anti-parallel states of a memory cell.

FIG. 8 is a graph illustrating the ratio of the third harmonic component 158 to the first harmonic component 156 for the parallel and anti-parallel states of memory cell 26. As indicated at 160, with memory cell 26 in the parallel state, the ratio of the third harmonic component 158 to the first harmonic component 156 is essentially zero. This indicates that memory cell 26 in the parallel state does not distort the sinusoidal voltage provided across memory cell 26 by waveform generator 138. As indicated at 162, with memory cell 26 in the anti-parallel state, the ratio of the third harmonic component 158 to the first harmonic component 156 is about 0.05 or five percent. A threshold value of 0.025 can be used to distinguish between the parallel and anti-parallel states of memory cell 26.

In the present embodiment, the third harmonic is used to distinguish between the states of memory cell 26. However, in other embodiments, other harmonics or even the sum of harmonics can be used to distinguish between the states of memory cells 26.

What is claimed is:

1. A magnetic memory, comprising:
   a memory cell in an unknown first state; and
   a sensing circuit configured to charge a capacitor through the memory cell in the unknown first state and discharge the capacitor through the memory cell in the unknown first state to determine the unknown first state of the memory cell.

2. The magnetic memory of claim 1, where the sensing circuit charges the capacitor before the sensing circuit discharges the capacitor.

3. The magnetic memory of claim 1, where the sensing circuit discharges the capacitor before the sensing circuit charges the capacitor.

4. The magnetic memory of claim 1, where the sensing circuit provides a first voltage across the memory cell to charge the capacitor and a second voltage across the memory cell to discharge the capacitor.

5. The magnetic memory of claim 4, where the first voltage is greater than the second voltage.

6. The magnetic memory of claim 4, where the first voltage is less than the second voltage.

7. A magnetic memory, comprising:
   a memory cell in an unknown first state; and
   a sensing circuit configured to charge a capacitor through the memory cell in the unknown first state and discharge the capacitor through the memory cell in the unknown first state to determine a state of the memory cell, where the sensing circuit provides a first voltage across the memory cell to charge the capacitor and a second voltage across the memory cell to discharge the capacitor and the first voltage is applied for a first period and the second voltage is applied for a second period, where the first voltage is greater than the second voltage and the first period is less than the second period.

8. A magnetic memory, comprising:
   a memory cell in an unknown first state; and
   a sensing circuit configured to charge a capacitor through the memory cell in the unknown first state and discharge the capacitor through the memory cell in the unknown first state to determine a state of the memory cell, where the sensing circuit provides a first voltage across the memory cell to charge the capacitor and a second voltage across the memory cell to discharge the capacitor and the first voltage is applied for a first period and the second voltage is applied for a second period, where the first voltage is less than the second voltage and the first period is greater than the second period.

9. The magnetic memory of claim 1, where the capacitor is set to a reference voltage prior to charging and discharging the capacitor, and the reference voltage is compared to a resulting voltage to determine the unknown first state of the memory cell.

10. The magnetic memory of claim 1, where the memory cell is configured to provide an unknown second state, where a voltage is applied across the memory cell in the unknown first state to obtain a first resulting voltage and the voltage is applied across the memory cell in the unknown second state to obtain a second resulting voltage.

11. A magnetic memory, comprising:
    a memory cell in an unknown first state; and
    a sensing circuit configured to charge a capacitor through the memory cell in the unknown first state and discharge the capacitor through the memory cell in the unknown first state to determine a state of the memory cell, where the memory cell is configured to provide an unknown second state and a voltage is applied across the memory cell in the unknown first state to obtain a first resulting voltage and the voltage is applied across the memory cell in the unknown second state to obtain a second resulting voltage, where a reference voltage is applied to the capacitor prior to charging and discharging the capacitor, and the reference voltage is between the first resulting voltage and the second resulting voltage.

12. A magnetic memory, comprising:
    an array of magnetic memory cells including a memory cell that is written to a state; and
    a read circuit comprising a sense circuit, where the read circuit is configured to select the memory cell that is written to the state in the array of memory cells and couple the selected memory cell to the sense circuit that is configured to provide a charge current and a discharge current through the selected memory cell to obtain a resulting voltage prior to any re-writing of the selected memory cell and to determine the state of the selected memory cell via the resulting voltage.

13. The magnetic memory of claim 12, where the sense circuit provides the charge current at a first voltage across the selected memory cell and the discharge current at a second voltage across the selected memory cell, where the selected memory cell presents a different resistance value at the first voltage relative to the second voltage in at least one state.

14. A magnetic memory, comprising:
    an array of magnetic memory cells including a memory cell that is written to a state; and
    a read circuit comprising a sense circuit, where the read circuit is configured to select the memory cell that is written to the state in the array of memory cells and couple the selected memory cell to the sense circuit that is configured to provide a charge current and a discharge current through the selected memory cell to obtain a resulting voltage prior to any re-writing of the selected memory cell and to determine the state of the selected memory cell via the resulting voltage, the read circuit further comprising a capacitor that is preset to a beginning voltage and charged and discharged by the sense circuit to the resulting voltage that is compared to a threshold voltage to determine the state of the selected memory cell, where the beginning voltage and the threshold voltage are the same.

15. A magnetic memory, comprising:
    a magnetic memory cell written to a first state; and
    a sensing circuit configured to provide a first voltage across the magnetic memory cell to charge a capacitor through the magnetic memory cell and to provide a second voltage across the magnetic memory cell to discharge the capacitor through the magnetic memory cell, where the sensing circuit provides a high voltage in one of the first voltage and the second voltage and a low voltage in the other one of the first voltage and the second voltage and the magnetic memory cell provides a substantially equal resistance in the first state and in a second state with the high voltage across the magnetic memory cell and a higher resistance in one of the first state and the second state with the low voltage across the magnetic memory cell.

16. A magnetic memory, comprising:

a magnetic memory cell written to a first state; and a sensing circuit configured to provide a first voltage across the magnetic memory cell to charge a capacitor through the magnetic memory cell and to provide a second voltage across the magnetic memory cell to discharge the capacitor through the magnetic memory cell, where the sensing circuit provides a high voltage in one of the first voltage and the second voltage and a low voltage in the other one of the first voltage and the second voltage and the magnetic memory cell provides a substantially equal resistance in the first state and in a second state with the high voltage across the magnetic memory cell and a higher resistance in one of the first state and the second state with the low voltage across the magnetic memory cell, where the sensing circuit is configured to charge and discharge the capacitor to a resulting voltage and to determine the first state of the magnetic memory cell via comparing the resulting voltage to a reference voltage.

* * * * *